(12) United States Patent
Kuang et al.

(10) Patent No.: US 12,217,961 B2
(45) Date of Patent: Feb. 4, 2025

(54) HARD MASK TRIMMING IN METHOD FOR MANUFACTURING SEMICONDUCTOR DEVICE

(71) Applicant: TAIWAN SEMICONDUCTOR MANUFACTURING COMPANY, LTD., Hsinchu (TW)

(72) Inventors: Chia-Chien Kuang, Hsinchu (TW); Tze-Chung Lin, Hsinchu (TW); Li-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 391 days.

(21) Appl. No.: 17/856,376

(22) Filed: Jul. 1, 2022

(65) Prior Publication Data
US 2024/0006177 A1    Jan. 4, 2024

(51) Int. Cl.
| | |
|---|---|
| *H01L 21/033* | (2006.01) |
| *H01L 21/02* | (2006.01) |
| *H01L 21/308* | (2006.01) |
| *H01L 21/311* | (2006.01) |
| *H01L 29/66* | (2006.01) |

(52) U.S. Cl.
CPC ...... *H01L 21/0337* (2013.01); *H01L 21/0206* (2013.01); *H01L 21/3086* (2013.01); *H01L 21/31122* (2013.01); *H01L 29/66439* (2013.01); *H01L 29/66545* (2013.01); *H01L 29/66742* (2013.01); *H01L 21/0332* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 2021/0242334 A1* | 8/2021 | Li | H01L 29/66818 |
| 2022/0069204 A1* | 3/2022 | Ko | H10N 70/063 |

* cited by examiner

*Primary Examiner* — Roberts P Culbert
(74) *Attorney, Agent, or Firm* — Birch, Stewart, Kolasch & Birch, LLP

(57) ABSTRACT

A method for manufacturing a semiconductor device includes: forming a patterned hard mask on a patterned structure disposed on a substrate, such that a hard mask portion of the patterned hard mask is disposed on a fin portion of the patterned structure; and laterally trimming the hard mask portion by a lateral etching process. The lateral etching process includes a radical etching process and a chemical etching process. Alternatively, the lateral etching process includes a radical etching process, a plasma etching process, or a combination thereof, and a cleaning process.

20 Claims, 12 Drawing Sheets

HARD MASK TRIMMING IN METHOD FOR MANUFACTURING SEMICONDUCTOR DEVICE

BACKGROUND

In a method for manufacturing a semiconductor device, a self-aligned multiple patterning process, such as a self-aligned double patterning (SADP) process, a self-aligned quadruple patterning (SAQP) process, or the like, is used to form smaller features without using extreme ultraviolet (EUV) lithography. A high dielectric constant (high-k) dielectric material, such as a metal oxide material, is used as a hard mask material in the self-aligned multiple patterning process to replace a photoresist material so as to confer better resistivity to a thermal process, a dry etching process, a wet etching process, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
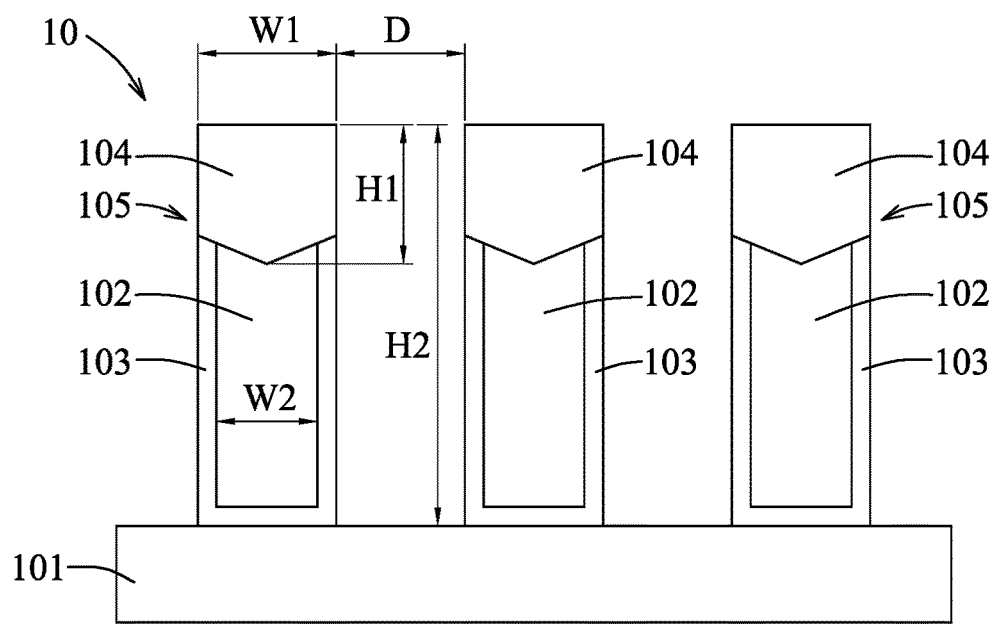
FIG. 1 is a schematic view illustrating a short-loop structure before being trimmed by a lateral etching process in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
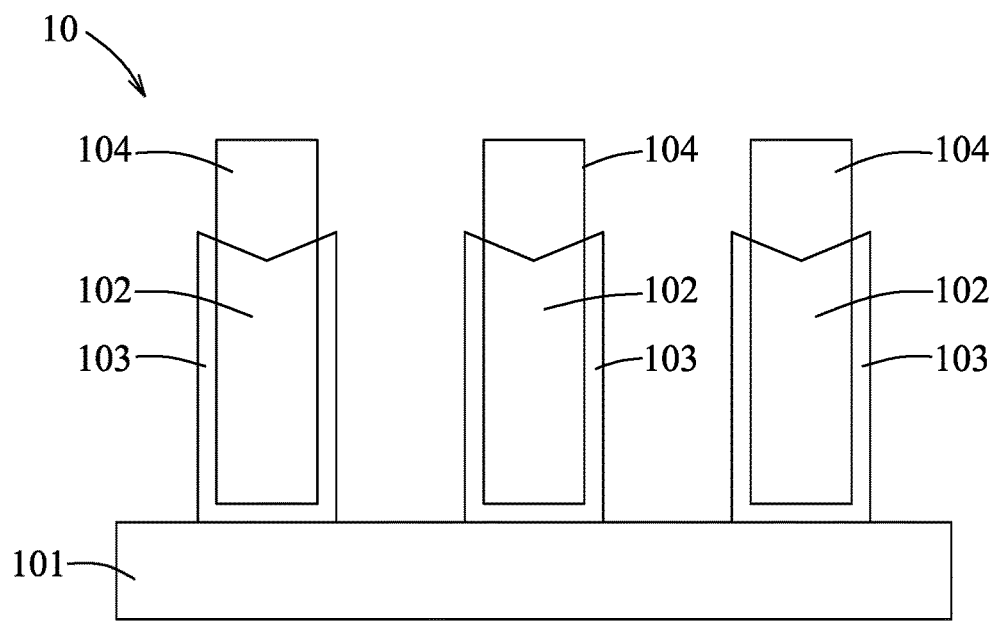
FIG. 2 is a schematic view illustrating the short-loop structure after being trimmed by the lateral etching process in accordance with some embodiments of the present disclosure.

The present disclosure is directed to a method for manufacturing a semiconductor device in which a patterned hard mask used for a self-aligned multiple patterning process (for example, but not limited to, a self-aligned double patterning (SADP) process, a self-aligned quadruple patterning (SAQP) process, or the like) is trimmed by a lateral etching process so as to control the dimensions of hard mask portions of the patterned hard mask. FIG. 1 is a schematic view illustrating a short-loop structure 10 before being trimmed by the lateral etching process, and FIG. 2 is a schematic view illustrating the short-loop structure 10 after being trimmed by the lateral etching process. A short-loop structure is a structure which has a short turn-around time and can produce the desired test results quickly. Referring to the example illustrated in FIG. 1, the short-loop structure 10 includes a substrate 101; a plurality of strip portions 102 disposed on the substrate 101 and spaced apart from each other; a plurality of spacers 103 disposed on the substrate 101 to separate the strip portions 102 from the substrate 101, spaced apart from each other, and laterally cover the strip portions 102, respectively; and a plurality of hard mask portions 104 disposed on the strip portions 102 and the spacers 103, respectively. In some embodiment, the substrate 101 includes, for example, but not limited to, silicon, or the like. Other materials suitable for the substrate 101 are within the contemplated scope of the present disclosure. In some embodiments, the strip portions 102 include a first dielectric material, and the spacers 103 include a second dielectric material which has an etch selectivity different from that of the first dielectric layer. In some embodiments, the strip portions 102 include silicon oxide (SiO), or the like, and the spacers 103 include silicon nitride (SiN), silicon carbon nitride (SiCN), silicon carbon oxynitride (SiOCN), or the like. Other materials suitable for the strip portions 102 and the spacers 103 are within the contemplated scope of the present disclosure. In some embodiments, the hard mask portions 104 include a high-k dielectric material, for example, but not limited to, hafnium-based (Hf-based) dielectric materials, zirconium-based (Zr-based) dielectric materials, aluminum-based (Al-based) dielectric materials, or the like, or combinations thereof. In some embodiments, the hard mask portions 104 may include a metal oxide material, for example, but not limited to, hafnium oxide ($HfO_2$), aluminum oxide ($Al_2O_3$), zirconium oxide ($ZrO_2$), or the like, or combinations thereof. Other metal oxide materials suitable for the hard mask portions 104 are within the contemplated scope of the present disclosure. Each of the strip portions 102 cooperates with a corresponding one of the spacers 103 and a corresponding one of the hard mask portions 104 to constitute a fin feature 105. The fin feature 105 includes a fin portion and a corresponding one of the hard mask portions 104 disposed on the fin portion. The fin portion includes one of the strip portions 102 and a corresponding one of the spacers 103.

In some embodiments, each of the hard mask portions 104 has a width (W1) ranging from about 10 nm (nanometers) to about 20 nm. In some embodiments, the width (W1) of each of the hard mask portions 104 ranges from about 14 nm to about 18 nm. In some embodiments, each of the hard mask portions 104 has a height (H1) ranging from about 20 nm to about 36 nm. In some embodiments, the height (H1) of each of the hard mask portions 104 ranges from about 26 nm to about 30 nm. In some embodiments, the fin feature 105 has a height (H2) ranging from about 80 nm to about 92 nm. In some embodiments, the height (H2) of the fin feature 105 ranges from about 84 nm to about 88 nm. In some embodiments, each of the strip portions 102 has a width (W2) ranging from about 5 nm to about 9 nm. In some embodiments, the width (W2) of each of the strip portions 102 ranges from about 6 nm to about 8 nm. In some embodiments, a fin-to-fin critical dimension (D) of the fin features 105 (i.e., a spacing distance between two adjacent ones of the fin features 105) ranges from about 20 nm to about 80 nm. In some embodiments, the fin-to-fin critical dimension (D) of the fin features 105 ranges from about 40 nm to about 60 nm.

Figure 3:
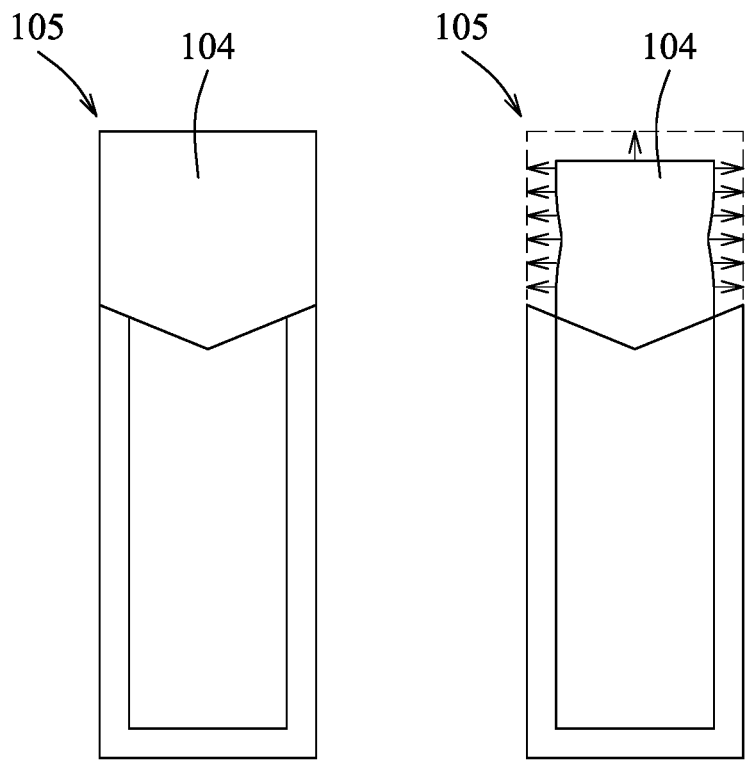
FIG. 3 is a schematic view illustrating a comparison of dimension of a fin feature of the short-loop structure before and after being trimmed by the lateral etching process in accordance with some embodiments of the present disclosure.

Referring to the example illustrated in FIG. 2, which is a schematic view illustrating the short-loop structure 10 after the lateral etching process, lateral portions of each of the hard mask portions 104 are trimmed by the lateral etching process, and a top part of each of the hard mask portions 104 may be etched away by the lateral etching process. In some embodiments, the lateral etching process is an anisotropic etching process, in which a lateral etching rate is larger than a vertical etching rate. FIG. 3 is a schematic view illustrating a comparison of dimension of the fin feature 105 before and after the lateral etching process. In some embodiments, a lateral etch amount of each of the hard mask portions 104 ranges from about 2 nm to about 7 nm. In some embodiments, the lateral etch amount of each of the hard mask portions 104 ranges from about 3 nm to about 6 nm. In some embodiments, the lateral etch amount of each of the hard mask portions 104 ranges from about 4 nm to about 5 nm. The lateral etch amount is defined as a thickness of a lateral portion of each of the hard mask portions 104 etched away by the lateral etching process. In some embodiments, a top lost amount of each of the hard mask portions 104 ranges from about 0 nm to about 6 nm. In some embodiments, the top lost amount of each of the hard mask portions 104 range from about 0 nm to about 5 nm. In some embodiments, the top lost amount of each of the hard mask portions 104 ranges from about 0 nm to about 4 nm. The top lost amount is defined as a thickness of a top part of each of the hard mask portions 104 etched away by the lateral etching process. It is desirable for the hard mask portions 104 trimmed by the lateral etching process to have a minimal top lost amount. In some embodiments, a sidewall roughness (LWR, i.e., line width roughness) of each of the hard mask portions 104 ranges from about 0 nm to about 2 nm. In some embodiments, the sidewall roughness of each of the hard mask portions 104 ranges from about 0 nm to about 1.5 nm. The line width roughness (LWR) generally refers to a roughness of a width of a line of material in a semiconductor device, for example, during a fabrication process. Evaluation of the line width roughness may be performed by analyzing top-down scanning electron microscope (SEM) images to derive a 36 deviation from the mean roughness of each of the hard mask portions 104. In some embodiments, an etch stop ratio of the hard mask portions 104 ranges from about 0% to about 5%. In some embodiments, the etch stop ratio of the hard mask portions 104 ranges from about 0% to about 4%. In some embodiments, the etch stop ratio of the hard mask portions 104 ranges from about 0% to about 3%. The etch stop ratio is defined as a ratio of a number of the hard mask portions 104 with an etch stop failure (i.e., having the lateral etch amount of less than 0.5 nm) to a total number of the hard mask portions 104 trimmed by the lateral etching process.

Figure 4:
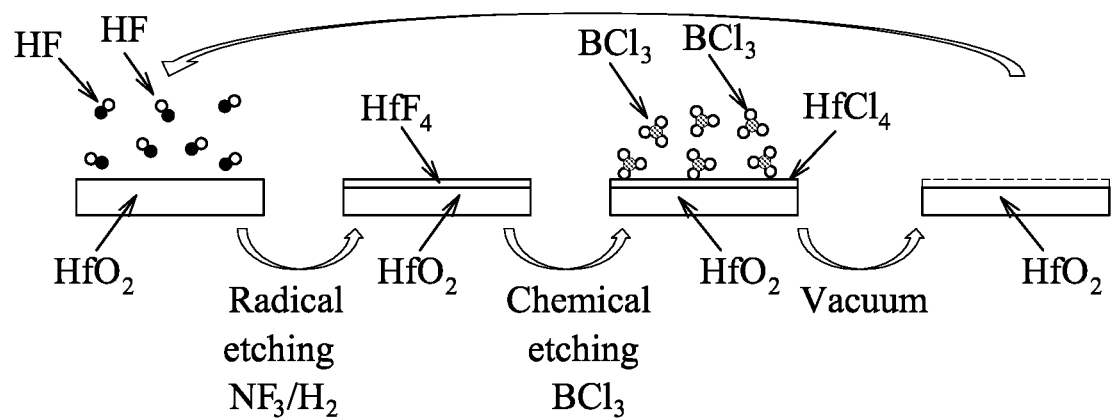
FIG. 4 is a schematic view illustrating a reaction mechanism of the lateral etching process conducted by a radical etching process and a chemical etching process in accordance with some embodiments of the present disclosure.

In some embodiments, the lateral etching process may include a radical etching process and a chemical etching process. FIG. 4 shows a schematic view illustrating a reaction mechanism of the lateral etching process conducted by the radical etching process and the chemical etching process. In some embodiments, an etchant gas for the radical etching process includes a hydrogen gas (H2) and a fluoride gas. In some embodiments, the fluoride gas may include, for example, but not limited to, nitrogen fluoride ($NF_3$), methyl fluoride ($CH_3F$), difluoromethane ($CH_2F_2$), trifluoromethane ($CHF_3$), perfluoromethane ($CF_4$), ethyl fluoride ($C_2H_5F$), difluoroethane ($C_2H_4F_2$), trifluoroethane ($C_2H_3F_3$), tetrafluoroethane ($C_2H_2F_4$), pentafluoroethane ($C_2HF_5$), perfluoroethane ($C_2F_6$), vinyl fluoride ($C_2H_3F$), difluoroethylene ($C_2H_2F_2$), trifluoroethylene ($C_2HF_3$), tetrafluoroethylene ($C_2F_4$), or combinations thereof. In some embodiments, an etchant gas for the chemical etching process includes a chloride gas. In some embodiments, the chloride gas may include, for example, but not limited to, chlorine ($Cl_2$), hydrogen chloride (HCl), boron chloride ($BCl_3$), methyl chloride ($CH_3C_1$), dichloromethane ($CH_2C_{12}$), trichloromethane ($CHCl_3$), perchloromethane ($CCl_4$), ethyl chloride ($C_2H_5C_1$), dichloroethane ($C_2H_4C_{12}$), trichloroethane ($C_2H_3Cl_3$), tetrachloroethane ($C_2H_2Cl_4$), pentachloroethane ($C_2HCl_5$), perchloroethane ($C_2Cl_6$), vinyl chloride ($C_2H_3C_1$), dichloroethylene ($C_2H_2C_{12}$), trichloroethylene ($C_2HCl_3$), tetrachloroethylene ($C_2Cl_4$), or combinations thereof. The reaction mechanism of the lateral etching process conducted by the radical etching process and the chemical etching process is also illustrated below, in which the fluoride gas is exemplified by nitrogen fluoride (NF$_3$) and the chloride gas is exemplified by boron chloride (BCl$_3$). The hard mask portions 104 to be trimmed by the lateral etching process are exemplified by hard mask portions made of hafnium oxide (HfO$_2$).

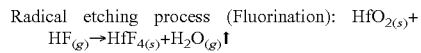

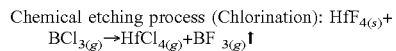

As shown in FIG. 4 and the reaction mechanism illustrated above, in the radical etching process, hafnium oxide (HfO$_2$) is subjected to fluorination with hydrogen fluoride (HF), which is produced by recombination of fluoride (F) radicals with hydrogen (H) radicals respectively formed from nitrogen fluoride (NF$_3$) and hydrogen (H$_2$), to form hafnium fluoride (HfF$_4$) and water vapor (H$_2$O). Hafnium fluoride is deposited on hafnium oxide, and the water vapor is evaporated. In the chemical etching process, hafnium fluoride formed from the fluorination is then subjected to chlorination with boron chloride (BCl$_3$) to form hafnium chloride (HfCl$_{4(g)}$) and boron fluoride (BF$_{3(g)}$), both of which can be removed, for example, but not limited to, under vacuum. The radical etching process and the chemical etching process may be performed alternately. That is, a plurality of cycles of alternating the radical etching process and the chemical etching process may be performed.

Figure 5:
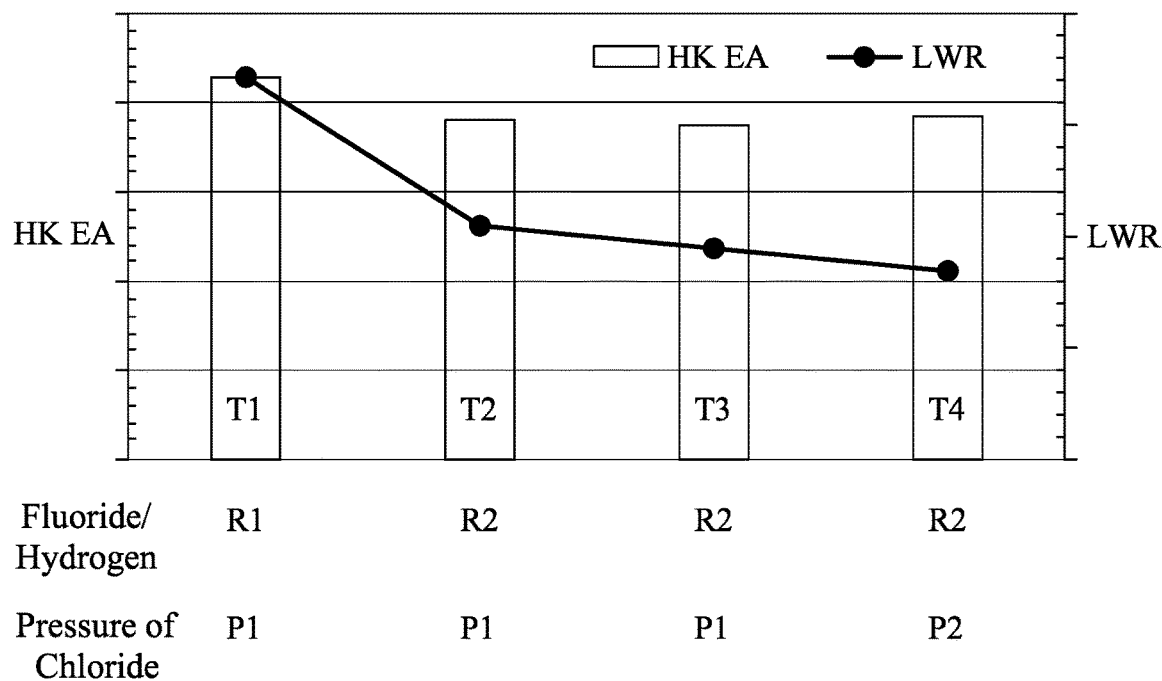
FIG. 5 is a graph plot illustrating relationship of sidewall roughness (i.e., LWR) of a hard mask portion of the fin feature of the short-loop structure versus a ratio value of fluoride to hydrogen and a pressure of chloride based on a substantially identical lateral etch amount of the hard mask portion.

FIG. 5 is a graph plot illustrating relationship of the sidewall roughness (i.e., LWR) of the hard mask portions 104 versus a ratio value of the fluoride gas to the hydrogen gas (i.e., fluoride/hydrogen) and a pressure of the chloride gas based on a substantially identical lateral etch amount of the hard mask portions 104 (HK EA). Tests T2, T3, T4 are conducted at a ratio value of the fluoride gas to the hydrogen gas (R2) being less than that (R1) for Test T1, and Test T4 is conducted at a pressure of the chloride gas (P2) being greater than that (P1) for Tests T1, T2, T3. As shown by the graph plot illustrated in FIG. 5, the sidewall roughness (i.e., LWR) of the hard mask portions 104 can be reduced effectively by reducing the ratio value of the fluoride gas to the hydrogen gas used in the radical etching process and by increasing the pressure of the chloride gas used in the chemical etching process. In some embodiments, the sidewall roughness (i.e., LWR) of the hard mask portions 104 can be reduced from a value ranging from about 3.3 nm to about 3.5 nm to a value ranging from about 2.2 nm to about 1.6 nm by reducing the ratio value of the fluoride gas to the hydrogen gas from a ratio value ranging from about 7/40 to about 9/40 to a ratio value ranging from about 2/40 to about 1/40, based on a lateral etch amount ranging from about 4.2 nm to about 3.8 nm of the hard mask portions 104. In some embodiments, the sidewall roughness (i.e., LWR) of the hard mask portions 104 can be reduced by a value ranging from about 1.2 nm to about 1.4 nm by reducing the ratio value of the fluoride gas to the hydrogen gas by a value ranging from about 6/40 to about 8/40, based on a lateral etch amount ranging from about 4.2 nm to about 3.8 nm. In some embodiments, the sidewall roughness (i.e., LWR) of the hard mask portions 104 can be reduced by a value ranging from about 0.1 nm to about 0.3 nm by increasing the pressure of the chloride gas by a value ranging from about 7 Torr to about 9 Torr, based on a lateral etch amount ranging from about 4.2 nm to about 3.8 nm.

Figure 6:
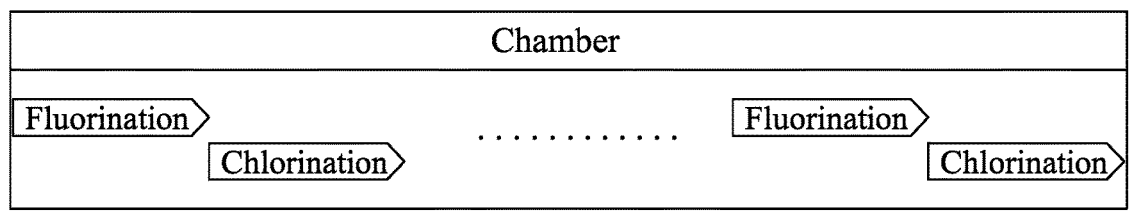
FIG. 6 is a schematic view illustrating the lateral etching process conducted by the radical etching process and the chemical etching process in accordance with some embodiments of the present disclosure.

Referring to FIG. 6, which is a schematic view illustrating the lateral etching process conducted by the radical etching process (i.e., the fluorination) and the chemical etching process (i.e., the chlorination), a plurality of cycles of alternating the radical etching process and the chemical etching process described above are conducted in a chamber. The lateral etching process is an etching process similar to an atomic layer etching process. In some embodiments, the radical etching process and the chemical etching process are conducted at a temperature ranging from about 200° C. to about 500° C. If the radical etching process and the chemical etching process are conducted at a temperature greater than 500° C., the etching rate of the hard mask portions 104 may be too fast and the etch selectivity may be worsened. If the radical etching process and the chemical etching process are conducted at a temperature less than 200° C., the etching rate of the hard mask portions 104 may be too slow. In some embodiments, the radical etching process is conducted at a power ranging from about 250 W to about 500 W. If the radical etching process is conducted at a power greater than 500 W, the etching rate of the hard mask portions 104 may be too fast and the etch selectivity may be worsened. If the radical etching process is conducted at a power less than 250 W, the etching rate of the hard mask portions 104 may be too slow. In some embodiments, the radical etching process is conducted at a pressure ranging from about 2000 mTorr to about 5000 mTorr. If the radical etching process is conducted at a pressure greater than 5000 mTorr, the etching rate of the hard mask portions 104 may be too fast and the etch selectivity may be worsened. If the radical etching process is conducted at a pressure less than 2000 mTorr, the etching rate of the hard mask portions 104 may be too slow. In some embodiments, the chemical etching process is conducted at a pressure ranging from about 2000 mTorr to about 24000 mTorr. If the chemical etching process is conducted at a pressure greater than 24000 mTorr, the etching rate of the hard mask portions 104 may be too fast and the etch selectivity may be worsened. If the chemical etching process is conducted at a pressure less than 2000 mTorr, the etching rate of the hard mask portions 104 may be too slow. In some embodiments, the radical etching process is conducted at a flow rate of the fluoride gas ranging from about 15 sccm to about 200 sccm and a flow rate of the hydrogen gas ranging from about 1000 sccm to about 2400 sccm. If the radical etching process is conducted at a flow rate of the fluoride gas being greater than 200 sccm and/or a flow rate of the hydrogen gas being greater than 2400 sccm, the etching rate of the hard mask portions 104 may be too fast and the etch selectivity may be worsened. If the radical etching process is conducted at a flow rate of the fluoride gas being less than 15 sccm and/or a flow rate of the hydrogen gas being less than 1000 sccm, the etching rate of the hard mask portions 104 may be too slow. In some embodiments, the chemical etching process is conducted at a flow rate of the chloride gas ranging from about 200 sccm to about 500 sccm. If the chemical etching process is conducted at a flow rate of the chloride gas being greater than 500 sccm, the etching rate of the hard mask portions 104 may be too fast and the etch selectivity may be worsened. If the chemical etching process is conducted at a flow rate of the chloride gas being less than 200 sccm, the etching rate of the hard mask portions 104 may be too slow. In some embodiments, an inert diluent gas may be used in the radical etching process and the chemical etching process. In some embodiments, the inert diluent gas may include, for example, but not limited to, argon (Ar), helium (He), or a combination thereof. Other suitable materials are within the contemplated scope of the present disclosure. In some embodiments, a flow rate of the inert diluent gas ranges from about 500 sccm to about 2000 sccm.

Figure 7:
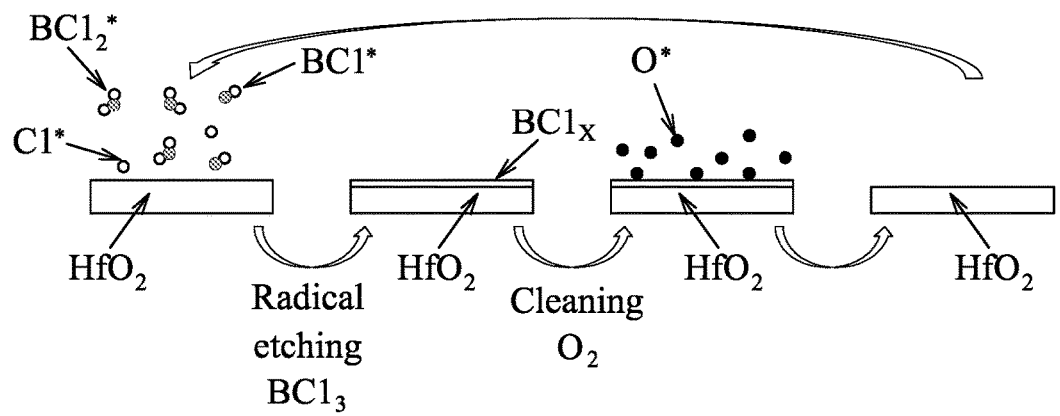
FIG. 7 is a schematic view illustrating a reaction mechanism of the lateral etching process conducted by a radical or plasma etching process and a cleaning process in accordance with some embodiments of the present disclosure.

In some embodiments, the lateral etching process may include a radical or plasma etching process and a cleaning process. FIG. 7 shows a schematic view illustrating a reaction mechanism of the lateral etching process conducted by the radical etching process and the cleaning process. The radical etching process is similar to the plasma etching process except that in the radical etching process, plasmas (which include ions and radicals) are subjected to a filtering process using an ion shield to filter the ions out of the plasmas such that only the radicals are introduced into a chamber for the etching process. In some embodiments, an etchant gas for the radical or plasma etching process includes a chloride gas. In some embodiments, the chloride gas may include, for example, but not limited to, chlorine ($Cl_2$), hydrogen chloride (HCl), boron chloride ($BCl_3$), methyl chloride ($CH_3Cl$), dichloromethane ($CH_2Cl_2$), trichloromethane ($CHCl_3$), perchloromethane ($CCl_4$), ethyl chloride ($C_2H_5Cl$), dichloroethane ($C_2H_4Cl_2$), trichloroethane ($C_2H_3Cl_3$), tetrachloroethane ($C_2H_2Cl_4$), pentachloroethane ($C_2HCl_5$), perchloroethane ($C_2Cl_6$), vinyl chloride ($C_2H_3Cl$), dichloroethylene ($C_2H_2Cl_2$), trichloroethylene ($C_2HCl_3$), tetrachloroethylene ($C_2Cl_4$), or combinations thereof. In some embodiments, a cleaning gas for the cleaning process includes oxygen gas ($O_2$). The reaction mechanism of the lateral etching process conducted by the radical etching process and the cleaning process is also illustrated below. The chloride gas for the radical etching process is exemplified by boron chloride ($BCl_3$), and the hard mask portions 104 to be trimmed by the lateral etching process is exemplified by hard mask portions made of hafnium oxide ($HfO_2$).

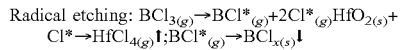

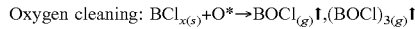

As shown in FIG. 7 and the reaction mechanism illustrated above, in the radical etching process, $BCl_3$ gas is dissociated into BCl* radicals and Cl* radicals. Hafnium oxide ($HfO_2$) is reacted with Cl* radicals to form hafnium chloride ($HfCl_4$) gas, which may be removed, for example, but not limited to, under vacuum. BCl* radicals are combined with each other to form $BCl_x$ polymer that is deposited on hafnium oxide. In the cleaning process using the oxygen gas, $BCl_x$ polymer is reacted with O* radicals to form BOCl gas and $(BOCl)_3$ gas, which can be removed, for example, but not limited to, under vacuum, so as to clean $BCl_x$ polymer from surfaces of the hard mask portions 104. The radical etching process and the cleaning process may be performed alternately. That is, a plurality of cycles of alternating the radical etching process and the cleaning process may be performed.

Figure 8:
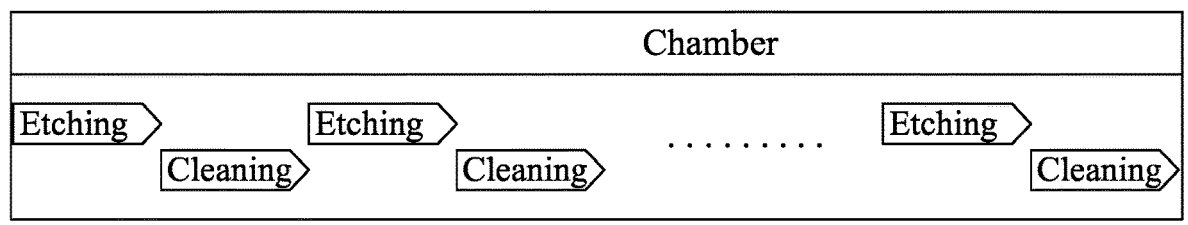
FIG. 8 is a schematic view illustrating the lateral etching process conducted by the radical or plasma etching process and the cleaning process in accordance with some embodiments of the present disclosure.
Figure 9:
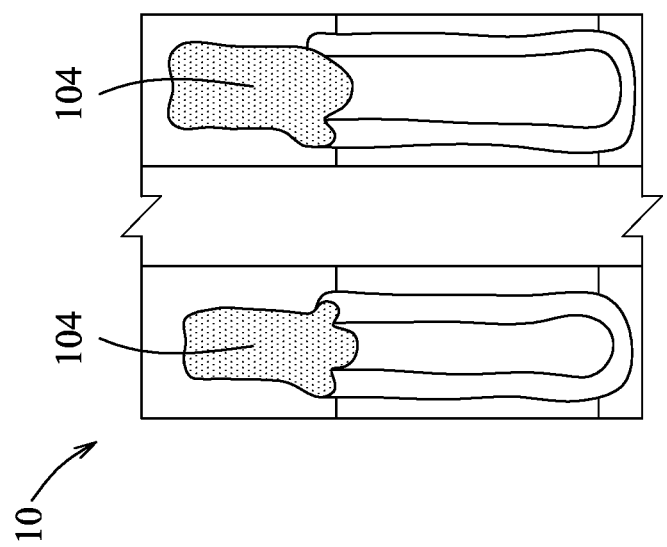
FIGS. 9 to 12 each illustrates a fragmentary view of the short-loop structure in which the hard mask portions are laterally trimmed by the lateral etching process conducted by the radical etching process and the chemical etching process in accordance with some embodiments of the present disclosure.
Figure 10:
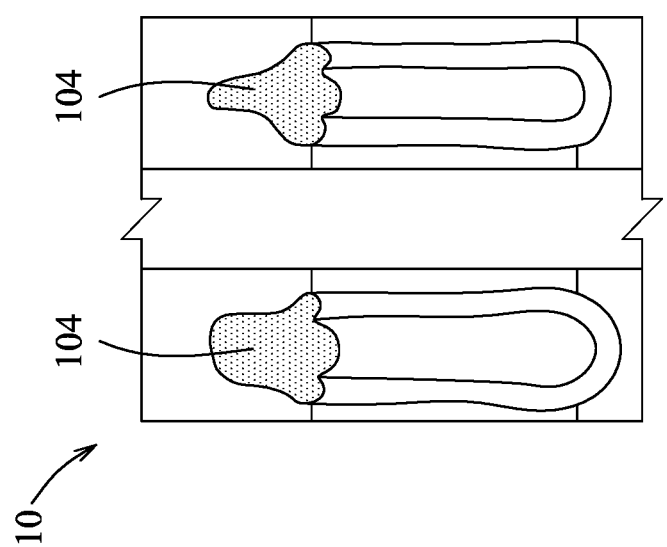
Figure 12:
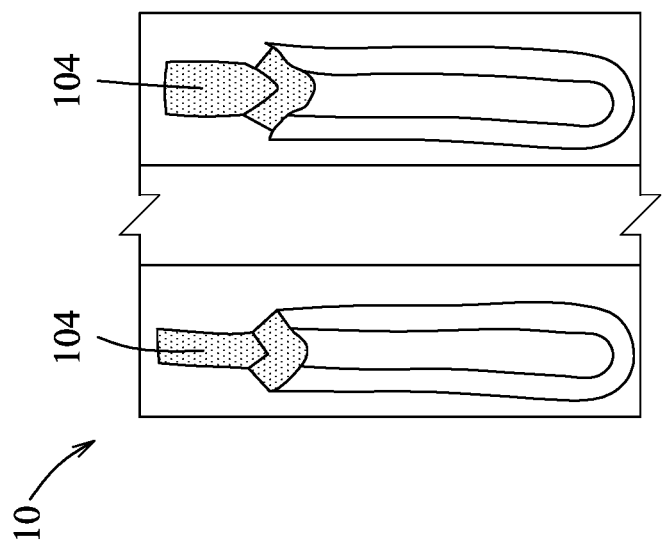

Referring to FIG. 8, which is a schematic view illustrating the lateral etching process conducted by the radical or plasma etching process and the cleaning process, a plurality of cycles of alternating the radical or plasma etching process and the cleaning process as described above are conducted in a chamber. In some embodiments, the plasma or radical etching process and the cleaning process are conducted at a temperature ranging from about 50° C. to about 130° C. If the plasma or radical etching process and the cleaning process are conducted at a temperature greater than 130° C., the etching rate of the hard mask portions 104 may be too fast and the etch selectivity may be worsened. If the plasma or radical etching process and the cleaning process are conducted at a temperature less than 50° C., the etching rate of the hard mask portions 104 may be too slow. In some embodiments, the radical etching process is conducted at a power ranging from about 250 W to about 750 W. If the radical etching process is conducted at a power greater than 750 W, the etching rate of the hard mask portions 104 may be too fast and the etch selectivity may be worsened. If the radical etching process is conducted at a power less than 250 W, the etching rate of the hard mask portions 104 may be too slow. In some embodiments, the plasma etching process and the cleaning process are conducted at a power ranging from about 250 W to about 1000 W. If the plasma etching process and the cleaning process are conducted at a power greater than 1000 W, the etching rate of the hard mask portions 104 may be too fast and the etch selectivity may be worsened. If the plasma etching process and cleaning process are conducted at a power less than 250 W, the etching rate of the hard mask portions 104 may be too slow. In some embodiments, the radical etching process is conducted at a pressure ranging from about 2 mTorr to about 15 mTorr. If the radical etching process is conducted at a pressure greater than 15 mTorr, the etching rate of the hard mask portions 104 may be too fast and the etch selectivity may be worsened. If the radical etching process is conducted at a pressure less than 2 mTorr, the etching rate of the hard mask portions 104 may be too slow. In some embodiments, the plasma etching process and the cleaning process are conducted at a pressure ranging from about 1 mTorr to about 10 mTorr. If the plasma etching process and the cleaning process are conducted at a pressure greater than 10 mTorr, the etching rate of the hard mask portions 104 may be too fast and the etch selectivity may be worsened. If the plasma etching process and cleaning process are conducted at a pressure less than 1 mTorr, the etching rate of the hard mask portions 104 may be too slow. In some embodiments, the radical etching process is conducted at flow rate of the chloride gas ranging from about 100 sccm to about 400 sccm. If the radical etching process is conducted at a flow rate of the chloride gas being greater than 400 sccm, the etching rate of the hard mask portions 104 may be too fast and the etch selectivity may be worsened. If the radical etching process is conducted at a flow rate of the chloride gas being less than 100 sccm, the etching rate of the hard mask portions 104 may be too slow. In some embodiments, the plasma etching process is conducted at flow rate of the chloride gas ranging from about 50 sccm to about 200 sccm. If the plasma etching process is conducted at a flow rate of the chloride gas being greater than 200 sccm, the etching rate of the hard mask portions 104 may be too fast and the etch selectivity may be worsened. If the plasma etching process is conducted at a flow rate of the chloride gas being less than 50 sccm, the etching rate of the hard mask portions 104 may be too slow. In some embodiments, the cleaning process is conducted at flow rate of the oxygen gas ranging from about 25 sccm to about 100 sccm. If the cleaning process is conducted at a flow rate of the oxygen gas being less than 25 sccm, etching byproducts (for example, but not limited to, $BCl_x$ polymer) would not be removed effectively. In some embodiments, an inert diluent gas may be used in the plasma etching process and the cleaning process. In some embodiments, the inert diluent gas may include, for example, but not limited to, argon (Ar). Other suitable materials are within the contemplated scope of the present disclosure. In some embodiments, a flow rate of the inert diluent gas ranges from about 10 sccm to about 200 sccm.

Figure 11:
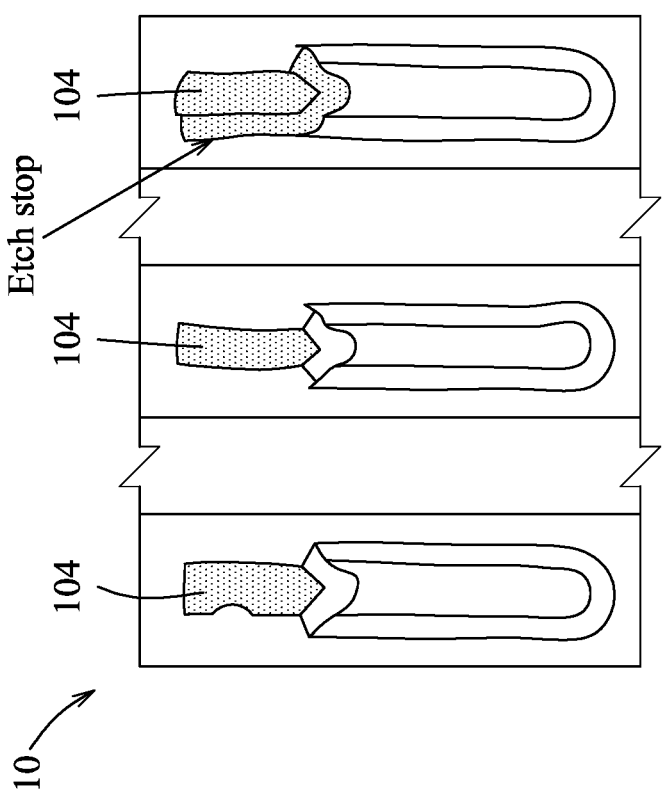
Figure 14:
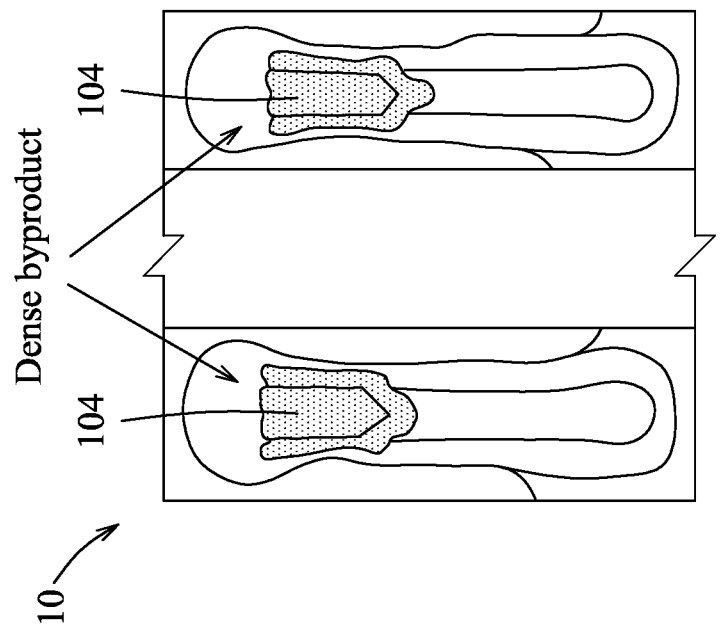
FIGS. 13 to 16 each illustrates a fragmentary view of the short-loop structure in which the hard mask portions are laterally trimmed by the lateral etching process conducted by the radical or plasma etching process and the cleaning process in accordance with some embodiments of the present disclosure.
Figure 13:
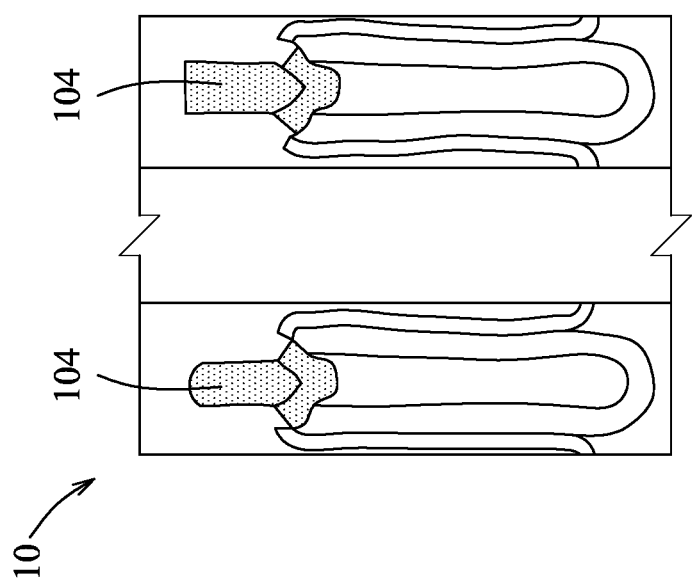

FIGS. 9 to 12 each illustrates a fragmentary view of the short-loop structure 10 shown in FIG. 2 in which the hard mask portions 104 are laterally trimmed by the lateral etching process conducted by the radical etching process (i.e., the fluorination) and the chemical etching process (i.e., the chlorination). In the short-loop structure 10 having the configuration shown in FIG. 9, the hard mask portions 104 obtained after the lateral etching process have a relatively large sidewall roughness which is greater than an upper limit of the aforesaid range of the sidewall roughness, and a relatively large top lost amount which is greater than an upper limit of the aforesaid range of the top lost amount, because the radical etching process (i.e., the fluorination) is conducted at a relatively large flow rate of the fluoride gas. In the short-loop structures 10 having the configurations respectively shown in FIGS. 10 and 11, the hard mask portions 104 obtained after the lateral etching process have a relatively small sidewall roughness, which is slightly greater than the upper limit of the aforesaid range of the sidewall roughness or is within the aforesaid range of the sidewall roughness, and a relatively small top lost amount, which is within the aforesaid range of the top lost amount, because the radical etching process (i.e., the fluorination) is conducted at a flow rate of the fluoride gas being less than that used to obtain the short-loop structure 10 having the configuration shown in FIG. 9. However, an etch stop (i.e., an un-etched sidewall) may be found in the short-loop structures 10, as shown in the short-loop structures 10 having the configuration shown in FIG. 11. In the short-loop structure 10 having the configuration shown in FIG. 12, the hard mask portions 104 obtained after the lateral etching process have a relatively small sidewall roughness, which is within the aforesaid range of the sidewall roughness, and a relatively small top lost amount, which is within the aforesaid range of the top lost amount, because the radical etching process (i.e., the fluorination) is conducted at a flow rate of the fluoride gas being less than that used to obtain the short-loop structure 10 having the configuration shown in FIG. 9. In addition, the etch stop found in short-loop structure 10 having the configuration shown in FIG. 11 is not found in the short-loop structure 10 having the configuration shown in FIG. 12, because the chemical etching process (i.e., the chlorination) is conducted at a temperature higher than that of the chemical etching process to form the short-loop structure 10 having the configuration shown in FIG. 11.

Figure 16:
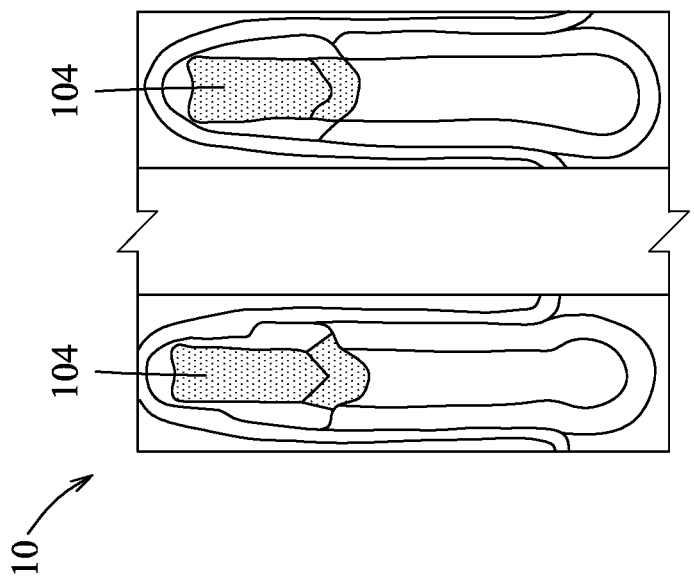
Figure 15:
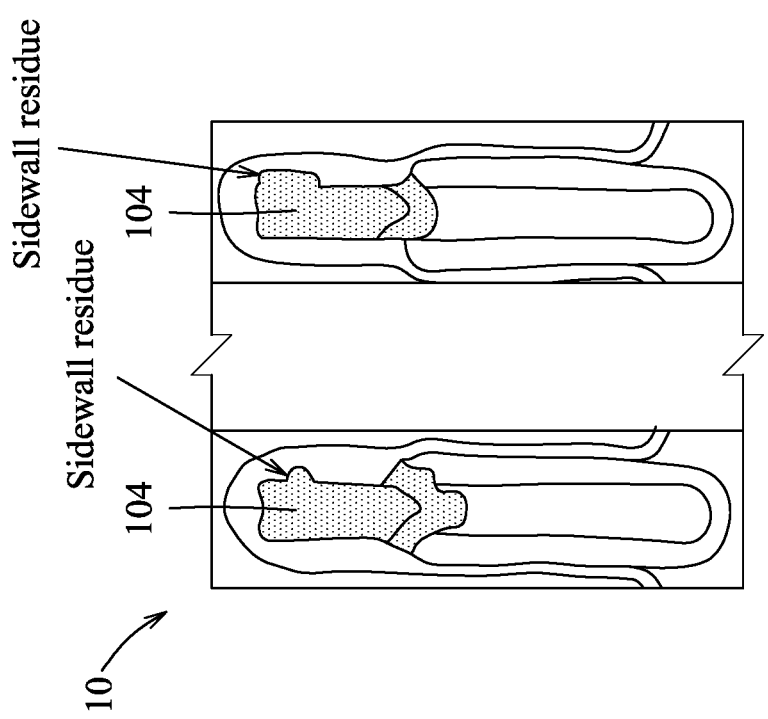

FIGS. 13 to 16 each illustrates a fragmentary view of the short-loop structure 10 shown in FIG. 2 in which the hard mask portions 104 are laterally trimmed by the lateral etching process conducted by the radical or plasma etching process with or without the cleaning process. In the short-loop structure 10 having the configuration shown in FIG. 13, the hard mask portions 104 obtained after the lateral etching process conducted by the radical etching process have a top lost amount substantially the same as the lateral etch amount. In the short-loop structure 10 having the configuration shown in FIG. 14, the hard mask portions 104 obtained after the lateral etching process conducted by the plasma etching process are formed with dense byproduct (for example, but not limited to, $BCl_x$ polymer) disposed thereon, because the lateral etching process is conducted merely by the plasma etching process without the cleaning process (i.e., without using oxygen gas to remove the byproduct). In the short-loop structures 10 having the configurations shown in FIGS. 15 and 16, the hard mask portions 104 obtained after the lateral etching process conducted by the plasma etching process followed by the cleaning process using oxygen gas, the byproduct (for example, but not limited to, $BCl_x$ polymer) can be effectively removed. In addition, a comparison of the configuration shown in FIG. 15 and that shown in FIG. 16 shows that when the plasma etching process is conducted for a relatively long time period, sidewall residues remaining on the hard mask portions 104 of the configuration shown in FIG. 15 can be removed effectively. The sidewall residues are not found in the configuration shown in FIG. 16 because the plasma etching process is conducted for a relatively long time period, compared to plasma etching process conducted for obtaining the short-loop structures 10 having the configuration shown in FIG. 15. In some embodiments, the plasma etching process may be conducted for a time period ranging from about 40 seconds to about 60 seconds.

Figure 17:
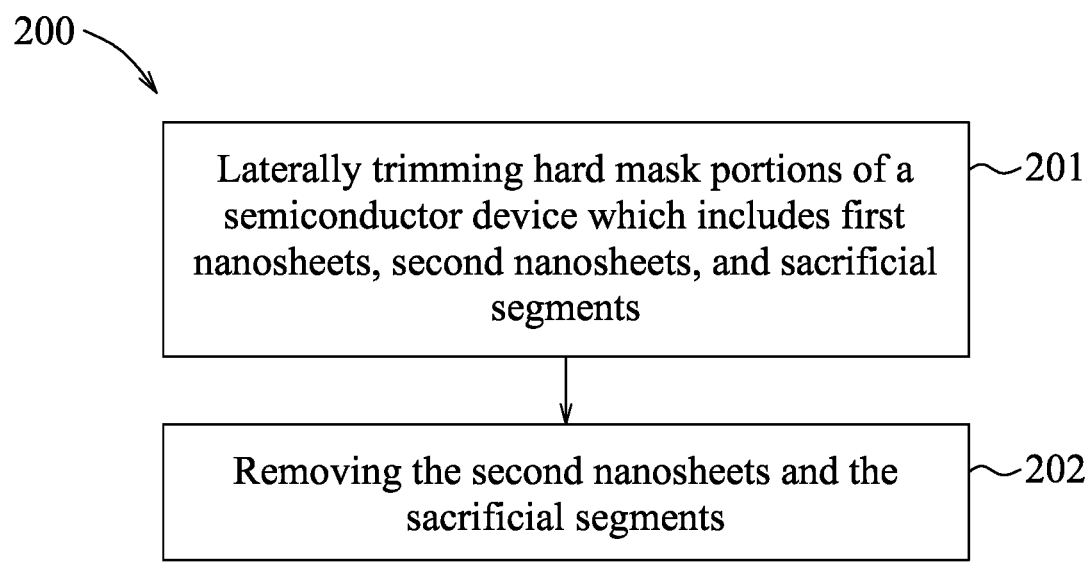
FIG. 17 is a flow diagram illustrating a method for manufacturing a semiconductor device in accordance with some embodiments.
Figure 18:
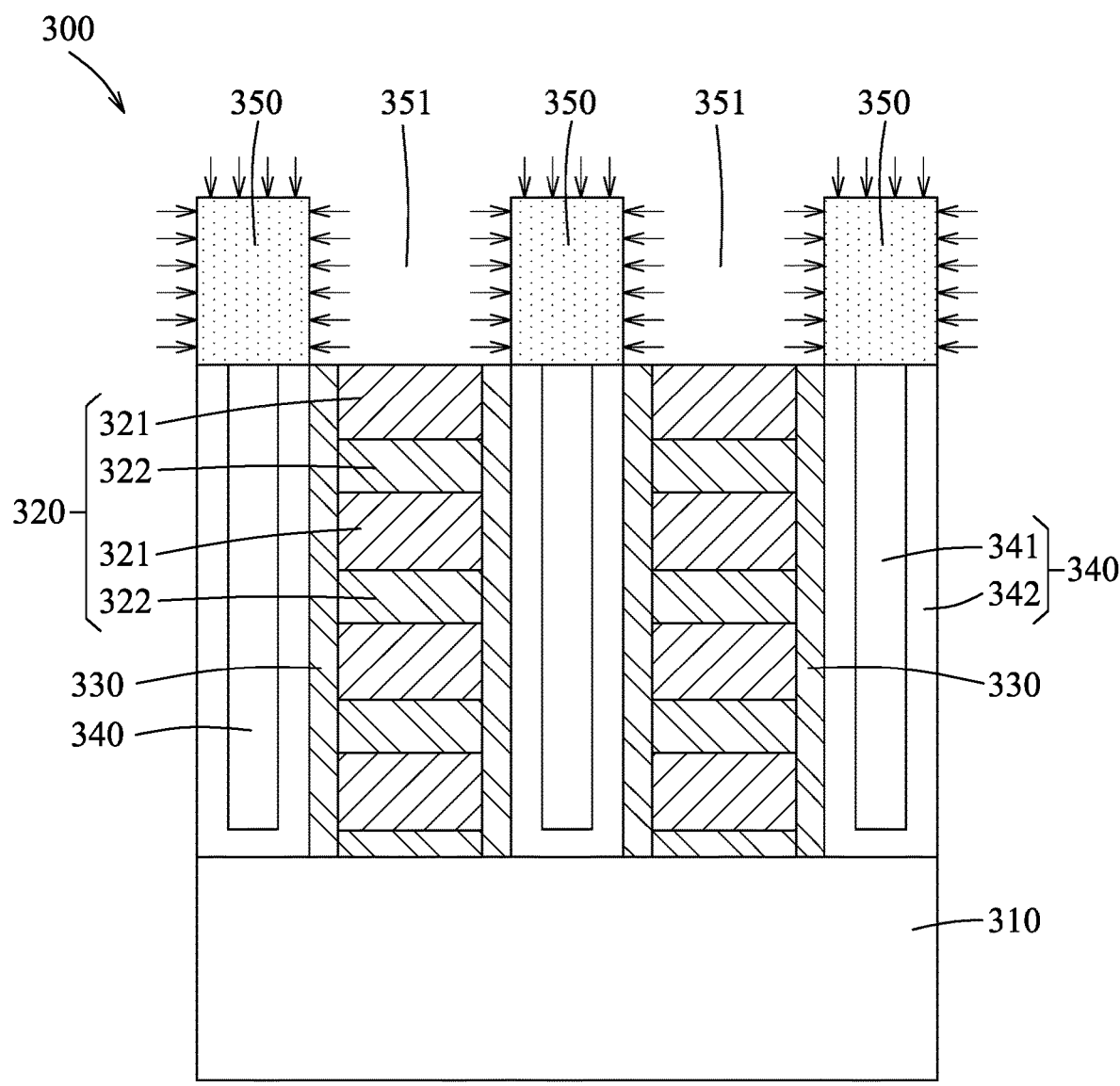
FIGS. 18 to 20 are schematic views illustrating some intermediate stages of the manufacturing method as depicted in FIG. 17 in accordance with some embodiments.
Figure 19:
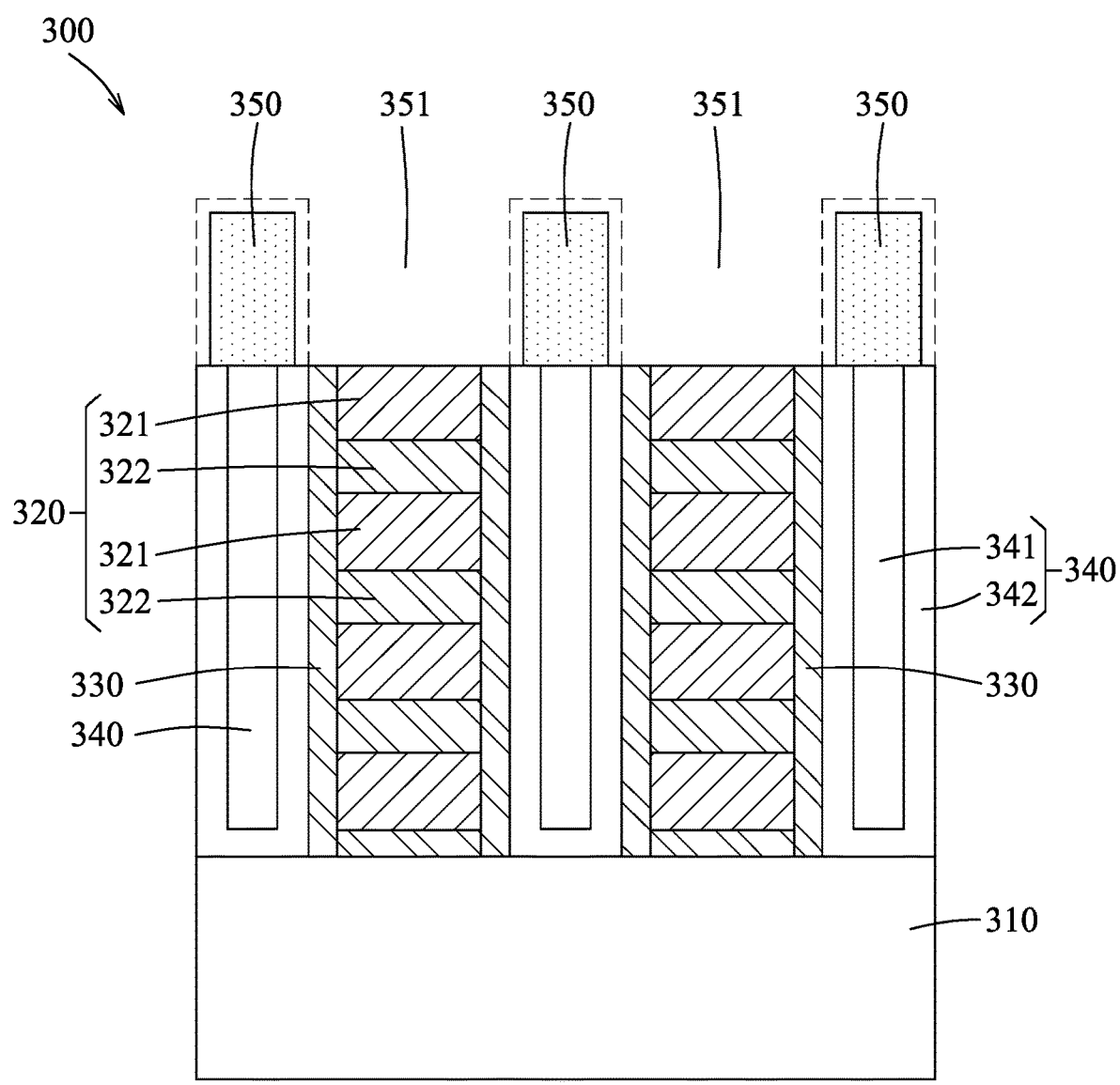
Figure 20:
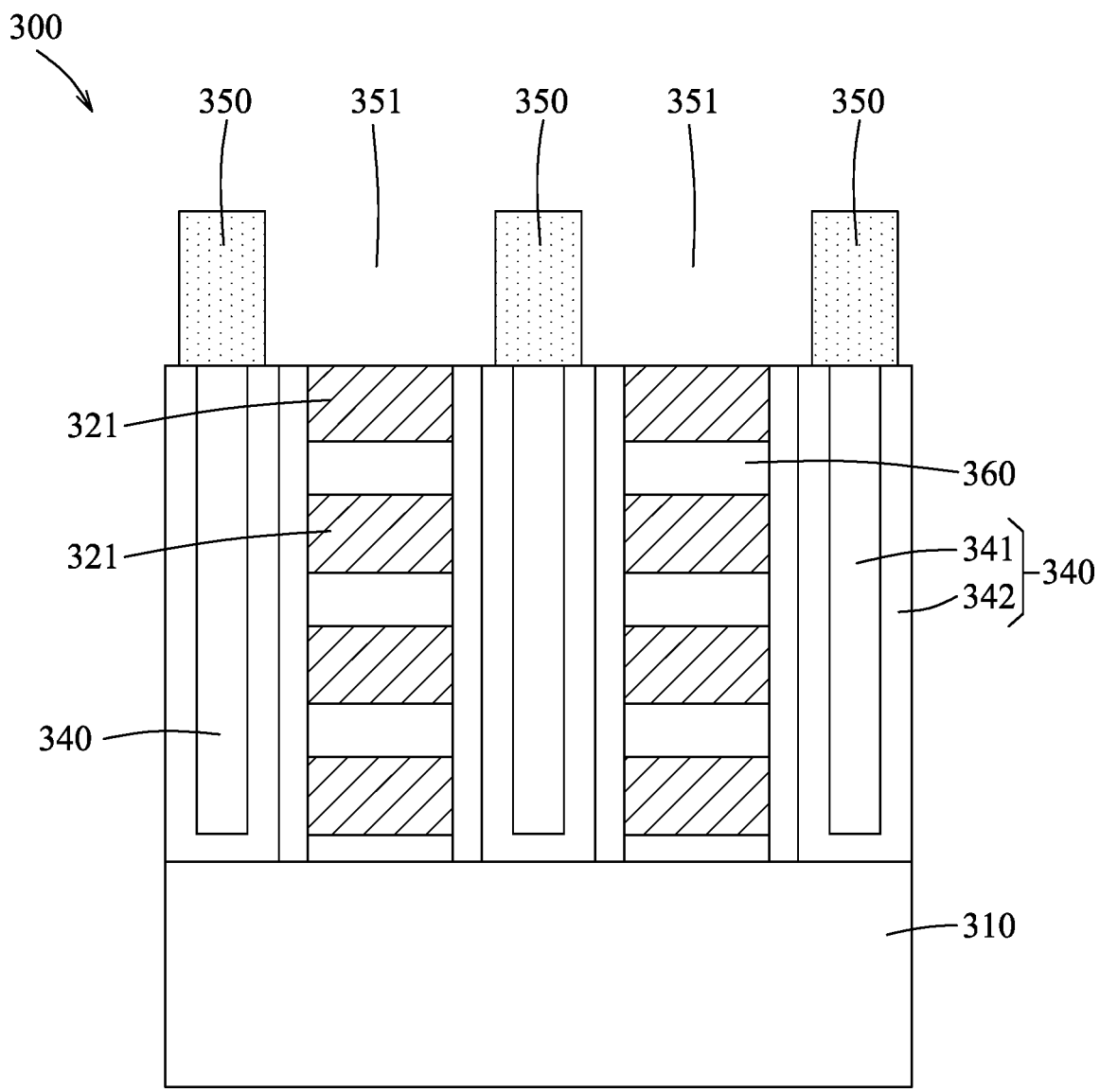

FIG. 17 illustrates a method 200 for manufacturing a semiconductor device in accordance with some embodiments in which hard mask portions are laterally trimmed. FIGS. 18 to 20 are schematic views of a semiconductor device 300 at some intermediate stages of the manufacturing method as depicted in FIG. 17 in accordance with some embodiments. Additional steps can be provided before, after or during the method 200, and some of the steps described herein may be replaced by other steps or be eliminated. Similarly, further additional features may be present in the semiconductor device 300, and/or features present may be replaced or eliminated in additional embodiments.

Referring to FIG. 17 and the examples illustrated in FIGS. 18 and 19, the method 200 begins at step 201, where hard mask portions are laterally trimmed. A semiconductor device 300 includes a substrate 310, a plurality of a nanosheet stacks 320 disposed on the substrate 310 and spaced apart from each other, a plurality of sacrificial segments 330 disposed on the substrate 310 such that each of the nanosheet stacks 320 is laterally covered by two corresponding ones of the sacrificial segments 330, a plurality of dielectric elements 340 each disposed between two corresponding ones of the sacrificial segments 330 and configured as a fin portion, and a plurality of hard mask portions 350 respectively disposed on the dielectric elements 340 so as to permit the nanosheet stacks 320 and the sacrificial segments 330 to expose through openings 351 defined by the hard mask portions 350.

In some embodiments, the substrate 310 may be, for example, but not limited to, a silicon-on-insulator (SOI) substrate, a germanium-on-insulator (GOI) substrate, a bulk semiconductor substrate, or the like. The substrate 310 may have multiple layers. The substrate 310 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The substrate 310 may be intrinsic or doped with a dopant or different dopants. Other materials suitable for the substrate 310 are within the contemplated scope of the present disclosure. In some embodiments, the substrate 310 is a bulk silicon substrate.

In some embodiments, each of the nanosheet stacks 320 includes a plurality of first nanosheets 321 and a plurality of second nanosheets 322 alternating with the first nanosheets 321. The first nanosheets 321 include a first semiconductor material, and the second nanosheets 322 include a second semiconductor material having an etch selectivity different from that of the first semiconductor material. In some embodiments, the first semiconductor material is silicon, and the second semiconductor material is silicon germanium (SiGe). Other semiconductor materials suitable for the first nanosheets 321 and the second nanosheets 322 are within the contemplated scope of the present disclosure.

In some embodiments, the sacrificial segments 330 includes a third semiconductor material. In some embodiments, the third semiconductor material is the same as the second semiconductor material. In some embodiments, the sacrificial segments 330 include, for example, but not limited to, silicon germanium, or the like.

Each of the dielectric elements 340 includes a first dielectric portion 341 and a second dielectric portion 342 disposed to separate the first dielectric portion 341 from corresponding ones of the sacrificial segments 330. In some embodiments, the first dielectric portion 341 may include an oxide material, for example, but not limited to, silicon oxide or the like, and the second dielectric portion 342 may include a low dielectric constant (low-k) dielectric material. In some embodiments, the second dielectric portion 342 may include a silicon-based dielectric material, for example, but not limited to, silicon oxide, silicon nitride, silicon oxycarbide, or the like. In some embodiments, the first dielectric portion 341 and the second dielectric portion 342 are made of different dielectric materials.

In some embodiments, the hard mask portions 350 include a high-k dielectric material, for example, but not limited to, hafnium-based (Hf-based) dielectric materials, zirconium-based (Zr-based) dielectric materials, aluminum-based (Al-based) dielectric materials, or the like, or combinations thereof. In some embodiments, the hard mask portions 350 may include metal oxide, for example, but not limited to, hafnium oxide, aluminum oxide, zirconium oxide, or the like, or combinations thereof.

The hard mask portions 350 is laterally trimmed by the lateral etching process described above so as to control the dimension thereof. The lateral etching process is indicated by arrows shown in FIG. 18. When the lateral portions of the hard mask portions 350 are trimmed by lateral etching process, top parts of the hard mask portions 350 may be etched away by the lateral etching process. The lateral portions and top parts removed by the lateral etching process are indicated by dotted lines shown in FIG. 19. In some embodiments, the lateral etching process are conducted by the radical etching process (the fluorination) and the chemical etching process (the chlorination) described above. The etch selectivity of the hard mask portions 350 relative to the dielectric elements 340 may range from about 100 to about 200, the etch selectivity of the hard mask portions 350 relative to the first nanosheets 321 may range from about 100 to about 200, and the etch selectivity of the hard mask portions 350 relative to the second nanosheets 322 may range from about 100 to about 200. In some embodiments, the lateral etching process are conducted by the radical or plasma etching process and the cleaning process described above. The etch selectivity of the hard mask portions 350 relative to the dielectric elements 340 may range from about 100 to about 200, the etch selectivity of the hard mask portions 350 relative to the first nanosheets 321 may range from about 2 to about and the etch selectivity of the hard mask portions 350 relative to the second nanosheets 322 may range from about 2 to about 10.

Referring to FIG. 17 and the examples illustrated in FIGS. 19 and 20, the method 200 proceeds to step 202, where second nanosheets and sacrificial segments are removed. The second nanosheets 322 and the sacrificial segments 330 are removed by an etching process, for example, but not limited to, a dry etching process or a wet etching process, to form cavities 360 for forming gate structures (not shown) in the cavities 360 so that the gate structures surrounds the first nanosheets 321. The first nanosheets 321 remaining after the etching process serve as channel portions of the semiconductor device 300.

In a method for manufacturing a semiconductor device of the present disclosure, a patterned hard mask used for a self-aligned multiple patterning process (for example, but not limited to, a self-aligned double patterning (SADP) process, a self-aligned quadruple patterning (SAQP) process, or the like) is trimmed by a lateral etching process so as to control the dimensions of hard mask portions of the patterned hard mask. In some embodiments, the lateral etching process may be conducted by a radical etching process and a chemical etching process. A plurality of cycles of alternating the radical etching process and the chemical etching process may be performed. In some embodiments, the lateral etching process may be conducted by a radical or plasma etching process and a cleaning process. A plurality of cycles of alternating the radical or plasma etching process and the cleaning process may be performed. The lateral etching process to trim the hard mask portions of the patterned hard mask of the present disclosure can be applied in a front-end-of-line (FEOL) process, a middle-end-of-line (MEOL) process, a back-end-of-line (BEOL) process, or combinations thereof.

In accordance with some embodiments of the present disclosure, a method for manufacturing a semiconductor device includes: forming a patterned hard mask on a patterned structure disposed on a substrate, such that a hard mask portion of the patterned hard mask is disposed on a fin portion of the patterned structure; and laterally trimming the hard mask portion by a lateral etching process which includes a radical etching process and a chemical etching process.

In accordance with some embodiments of the present disclosure, the radical etching process is conducted using an etching gas including a fluoride gas and a hydrogen gas.

In accordance with some embodiments of the present disclosure, the chemical etching process is conducted using an etching gas including a chloride gas.

In accordance with some embodiments of the present disclosure, the radical etching process and the chemical etching process are conducted at a temperature ranging from about 200° C. to about 500° C.

In accordance with some embodiments of the present disclosure, the radical etching process is conducted at a power ranging from about 250 W to about 500 W.

In accordance with some embodiments of the present disclosure, the radical etching process is conducted at a pressure ranging from about 2000 mTorr to about 5000 mTorr.

In accordance with some embodiments of the present disclosure, the chemical etching process is conducted at a pressure ranging from about 2000 mTorr to about 24000 mTorr.

In accordance with some embodiments of the present disclosure, the radical etching process is conducted at a flow rate of the fluoride gas ranging from about 15 sccm to about 200 sccm and a flow rate of the hydrogen gas ranging from about 1000 sccm to about 2400 sccm.

In accordance with some embodiments of the present disclosure, the chemical etching process is conducted at a flow rate of the chloride gas ranging from about 200 sccm to about 500 sccm.

In accordance with some embodiments of the present disclosure, a method for manufacturing a semiconductor device includes: forming a patterned hard mask on a patterned structure disposed on a substrate, such that a hard mask portion of the patterned hard mask is disposed on a fin portion of the patterned structure; laterally trimming the hard mask portion by a lateral etching process which includes a radical etching process, a plasma etching process, or a combination thereof, and a cleaning process.

In accordance with some embodiments of the present disclosure, the radical etching process, the plasma etching process, or the combination thereof is conducted using an etching gas including a chloride gas.

In accordance with some embodiments of the present disclosure, the cleaning process is conducted using an oxygen gas.

In accordance with some embodiments of the present disclosure, the radical etching process, the plasma etching process, or the combination thereof is conducted at a temperature ranging from about 50° C. to about 130° C.

In accordance with some embodiments of the present disclosure, the plasma etching process and the cleaning process are conducted at a power ranging from about 250 W to about 1000 W.

In accordance with some embodiments of the present disclosure, the plasma etching process and the cleaning process are conducted at a pressure ranging from about 1 mTorr to about 10 mTorr.

In accordance with some embodiments of the present disclosure, the plasma etching process is conducted at flow rate of the chloride gas ranging from about 50 sccm to about 200 sccm.

In accordance with some embodiments of the present disclosure, the cleaning process is conducted at flow rate of the oxygen gas ranging from about 25 sccm to about 100 sccm.

In accordance with some embodiments of the present disclosure, a method for manufacturing a semiconductor device includes: forming a patterned hard mask on a patterned structure disposed on a substrate, such that a hard mask portion of the patterned hard mask is disposed on a fin portion of the patterned structure; and laterally trimming the hard mask portion by a lateral etching process, such that the hard mask portion trimmed by the lateral etching process has a lateral etch amount ranging from about 2 nm to about 7 nm.

In accordance with some embodiments of the present disclosure, the hard mask portion trimmed by the lateral etching process has a top lost amount ranging from about 0 nm to about 5 nm.

In accordance with some embodiments of the present disclosure, the hard mask portion trimmed by the lateral etching process has a sidewall roughness ranging from about 0 nm to about 2 nm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a patterned hard mask on a patterned structure disposed on a substrate, such that a hard mask portion of the patterned hard mask is disposed on a fin portion of the patterned structure; and
    laterally trimming the hard mask portion by a lateral etching process which includes a radical etching process and a chemical etching process.

2. The method according to claim 1, wherein the radical etching process is conducted using an etching gas including a fluoride gas and a hydrogen gas.

3. The method according to claim 1, wherein the chemical etching process is conducted using an etching gas including a chloride gas.

4. The method according to claim 1, wherein the radical etching process and the chemical etching process are conducted at a temperature ranging from 200° C. to 500° C.

5. The method according to claim 1, wherein the radical etching process is conducted at a power ranging from 250 W to 500 W.

6. The method according to claim 1, wherein the radical etching process is conducted at a pressure ranging from 2000 mTorr to 5000 mTorr.

7. The method according to claim 1, wherein the chemical etching process is conducted at a pressure ranging from 2000 mTorr to 24000 mTorr.

8. The method according to claim 1, wherein the radical etching process is conducted at a flow rate of the fluoride gas ranging from 15 sccm to 200 sccm and a flow rate of the hydrogen gas ranging from 1000 sccm to 2400 sccm.

9. The method according to claim 1, wherein the chemical etching process is conducted at a flow rate of the chloride gas ranging from 200 sccm to 500 sccm.

10. A method for manufacturing a semiconductor device, comprising:
    forming a patterned hard mask on a patterned structure disposed on a substrate, such that a hard mask portion of the patterned hard mask is disposed on a fin portion of the patterned structure; and
    laterally trimming the hard mask portion by a lateral etching process which includes a radical etching process, a plasma etching process, or a combination thereof, and a cleaning process.

11. The method according to claim 10, wherein the radical etching process, the plasma etching process, or the combination thereof is conducted using an etching gas including a chloride gas.

12. The method according to claim 10, wherein the cleaning process is conducted using an oxygen gas.

13. The method according to claim 10, wherein the radical etching process, the plasma etching process, or the combination thereof is conducted at a temperature ranging from 50° C. to 130° C.

14. The method according to claim 10, wherein the plasma etching process and the cleaning process are conducted at a power ranging from 250 W to 1000 W.

15. The method according to claim 10, wherein the plasma etching process and the cleaning process are conducted at a pressure ranging from 1 mTorr to 10 mTorr.

16. The method according to claim 10, wherein the plasma etching process is conducted at flow rate of the chloride gas ranging from 50 sccm to 200 sccm.

17. The method according to claim 10, wherein the cleaning process is conducted at flow rate of the oxygen gas ranging from 25 sccm to 100 sccm.

18. A method for manufacturing a semiconductor device, comprising:
- forming a patterned hard mask on a patterned structure disposed on a substrate, such that a hard mask portion of the patterned hard mask is disposed on a fin portion of the patterned structure; and
- laterally trimming the hard mask portion by a lateral etching process, such that the hard mask portion trimmed by the lateral etching process has a lateral etch amount ranging from 2 nm to 7 nm.

19. The method according to claim 18, wherein the hard mask portion trimmed by the lateral etching process has a top lost amount ranging from 0 nm to 5 nm.

20. The method according to claim 18, wherein the hard mask portion trimmed by the lateral etching process has a sidewall roughness ranging from 0 nm to 2 nm.

* * * * *